United States Patent
Kim et al.

(10) Patent No.: US 8,183,928 B2
(45) Date of Patent: May 22, 2012

(54) CMOS POWER AMPLIFIER AND TEMPERATURE COMPENSATION CIRCUIT THEREOF

(75) Inventors: Yoo Hwan Kim, Gyunggi-do (KR); Hyun Hwan Yoo, Gyunggi-do (KR); Yoo Sam Na, Seoul (KR); Byeong Hak Jo, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/069,652

(22) Filed: Mar. 23, 2011

(65) Prior Publication Data
US 2011/0304398 A1   Dec. 15, 2011

(30) Foreign Application Priority Data
Jun. 11, 2010   (KR) .................. 10-2010-0055370

(51) Int. Cl.
  *H03F 3/04* (2006.01)
(52) U.S. Cl. ...................... 330/289; 330/285
(58) Field of Classification Search .............. 330/289, 330/285, 296
See application file for complete search history.

(56) References Cited

U.S. PATENT DOCUMENTS

| | | | |
|---|---|---|---|
| 7,027,789 B2* | 4/2006 | Ammar ................. | 455/232.1 |
| 7,193,470 B2* | 3/2007 | Lee et al. ................ | 330/285 |
| 7,405,618 B2* | 7/2008 | Lee et al. ................ | 330/136 |
| 7,656,233 B2* | 2/2010 | Lee ......................... | 330/289 |
| 7,994,862 B1* | 8/2011 | Pukhovski .............. | 330/289 |

FOREIGN PATENT DOCUMENTS

| | | |
|---|---|---|
| JP | 2004159123 | 6/2004 |
| KR | 1020020047341 | 6/2002 |
| KR | 1020080038998 | 4/2005 |

OTHER PUBLICATIONS

Koren Office Action for Application No. 10-2010-0055370 mailed Jun. 17, 2011.

* cited by examiner

*Primary Examiner* — Henry Choe
(74) *Attorney, Agent, or Firm* — Lowe, Hauptman, Ham & Berner, LLP (57) ABSTRACT

Disclosed is a CMOS power amplifier. A temperature compensation circuit of a CMOS power amplifier may include: a bias circuit unit supplying a gate bias voltage to a power amplification circuit part; a bias detection unit determining a class type of the power amplification circuit part according to the gate bias voltage; a temperature detection unit detecting a temperature-proportional voltage in proportion to ambient temperature; a temperature compensation control unit generating a compensation control value according to the temperature-proportion voltage in the class type determined by the bias detection unit; and a conversion unit converting the compensation control value of the temperature compensation control unit into a linear bias control value and providing the linear bias control value to the bias circuit unit, wherein the bias circuit unit compensates the gate bias voltage according to the linear bias control value of the conversion unit.

9 Claims, 5 Drawing Sheets

CMOS POWER AMPLIFIER AND TEMPERATURE COMPENSATION CIRCUIT THEREOF

CROSS-REFERENCE TO RELATED APPLICATIONS

This application claims the priority of Korean Patent Application No. 10-2010-0055370 filed on Jun. 11, 2010, in the Korean Intellectual Property Office, the disclosure of which is incorporated herein by reference.

BACKGROUND OF THE INVENTION

1. Field of the Invention

The present invention relates to a complementary metal-oxide-semiconductor (CMOS) power amplifier and a temperature compensation circuit thereof that can be applied to a mobile communications apparatus for mobile communications, and more particularly, to a CMOS power amplifier and a temperature compensation circuit thereof that perform temperature compensation on a gate bias voltage according to a class type of the CMOS power amplifier to thereby perform power amplification in a normal operating region, thereby maintaining constant characteristics regardless of temperature variations.

2. Description of the Related Art

In general, the operating characteristics of power amplifiers are varied according to gate bias values being applied thereto. Especially, the operating characteristics thereof are also varied according to temperature variations.

Temperature variations, determining the characteristics of power amplifiers, occur due to the surrounding environment with operating time according to whether the power amplifiers are operated or not. Therefore, in order to maintain constant operating characteristics, gate bias values of the power amplifiers need to be compensated so that the power amplifiers can perform an amplification operation in a normal operating region.

In the related art, a bias voltage, being applied to a power amplifier, is fixed. However, in the case that a bias voltage is fixed, a gate bias voltage of a power amplifier becomes constant at low or high temperature. As a result, the characteristics of the power amplifier are deteriorated.

Besides, in the related art, there is a method of compensating temperature by using a thermistor in order to perform the temperature compensation of a power amplifier. According to this method, a value depending on temperature variations can be compensated. However, since temperature variations are not considered on the basis of an operating region of the power amplifier, the power amplifier cannot perform amplification in an optimal operating region.

SUMMARY OF THE INVENTION

An aspect of the present invention provides a CMOS power amplifier and a temperature compensation circuit thereof that perform temperature compensation of a gate bias voltage according to a class type of the CMOS power amplifier to thereby perform an amplification operation in a normal operating region, thereby maintaining constant characteristics regardless of temperature variations.

According to an aspect of the present invention, there is provided a temperature compensation circuit of a CMOS power amplifier, the temperature compensation circuit including: a bias circuit unit supplying a gate bias voltage to a power amplification circuit part; a bias detection unit determining a class type of the power amplification circuit part according to the gate bias voltage; a temperature detection unit detecting a temperature-proportional voltage in proportion to ambient temperature; a temperature compensation control unit generating a compensation control value according to the temperature-proportion voltage in the class type determined by the bias detection unit; and a conversion unit converting the compensation control value of the temperature compensation control unit into a linear bias control value and providing the linear bias control value to the bias circuit unit, wherein the bias circuit unit compensates the gate bias voltage according to the linear bias control value of the conversion unit.

The conversion unit may include: a first conversion unit converting the compensation control value of the temperature compensation control unit into a digital signal; and a second conversion unit converting the digital signal from the first conversion unit into the linear bias control value.

The first conversion unit may include a plurality of first through n-th comparators individually comparing the compensation control value of the temperature compensation control unit with a plurality of reference voltages and converting the compensation control value into respective digital codes according to comparison results.

The first conversion unit may perform conversion according to a first conversion resolution at a predetermined low temperature and may perform conversion according to a second conversion resolution at a predetermined high temperature.

According to another aspect of the present invention, there is provided a CMOS power amplifier including: a power amplification circuit part operating according to a gate bias voltage and amplifying a power of an input signal; a bias circuit unit generating the gate bias voltage; a bias detection unit determining a class type of the power amplification circuit part according to the gate bias voltage; a temperature detection unit detecting a temperature-proportional voltage in proportion to ambient temperature; a temperature control unit generating a compensation control value according to the temperature-proportional voltage in the class type determined by the bias detection unit; and a conversion unit converting the compensation control value of the temperature compensation control unit into a linear bias control value, wherein the bias circuit unit compensates the linear gate bias voltage according to the bias control value of the conversion unit.

The power amplification circuit part may include an input matching unit, a power amplifier, and an output matching unit, the input matching unit may perform impedance matching between an RF input terminal and the power amplifier, the power amplifier may amplify a power of a signal from the input matching unit, and the output matching unit may perform impedance matching between the power amplifier and an RF power terminal.

The conversion unit may include: a first conversion unit converting the compensation control value of the temperature compensation control unit into a digital signal; and a second conversion unit converting the digital signal from the first conversion unit into the linear bias control value.

The first conversion unit may include first through n-th comparators individually comparing the compensation control value of the temperature compensation unit with a plurality of reference voltages and converting the compensation control value into respective digital codes according to comparison results.

The first conversion unit may convert the compensation control value according to a first conversion resolution at a predetermined low temperature and convert the compensation control value according to a second conversion resolution at a predetermined high temperature.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 1:
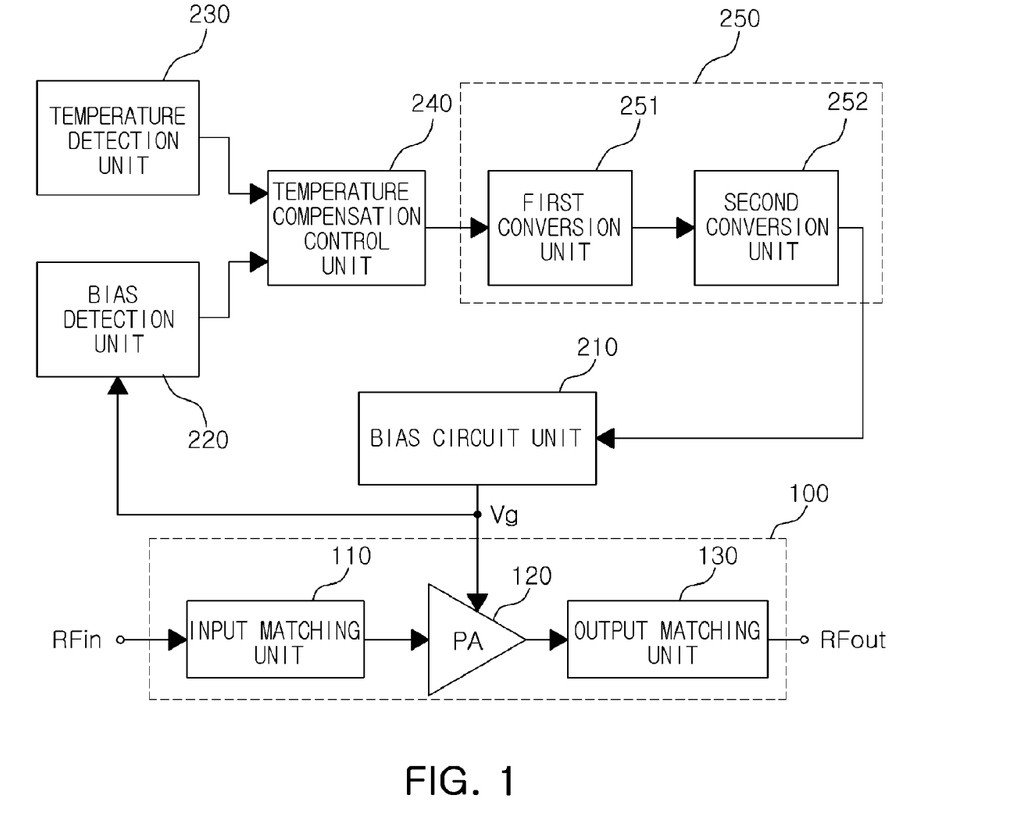
FIG. 1 is a block diagram illustrating a CMOS power amplifier according to an exemplary embodiment of the present invention.

FIG. 1 is a block diagram illustrating a CMOS power amplifier according to an exemplary embodiment of the invention.

Referring to FIG. 1, a CMOS power amplifier according to an exemplary embodiment of the invention may include a power amplification circuit part 100, a bias circuit unit 210, a bias detection unit 220, a temperature detection unit 230, a temperature compensation control unit 240, and a conversion unit 250. The power amplification circuit part 100 operates according to a gate bias voltage Vg and amplifies the power of an input signal. The bias circuit unit 210 supplies a gate bias voltage Vg to the power amplification circuit part 100. The bias detection unit 220 determines a class type of the power amplification circuit part 100 according to the gate bias voltage Vg. The temperature detection unit 230 detects a temperature-proportional voltage Vptat in proportion to ambient temperature. The temperature compensation control unit 240 generates a compensation control value Vc according to the temperature-proportional voltage Vptat in the class type determined by the bias detection unit 220. The conversion unit 250 converts the compensation control value Vc of the temperature compensation control unit 240 into a linear bias control value and supplies the linear bias control value to the bias circuit unit 210.

Here, the bias circuit unit 210 may be configured to compensate the gate bias voltage Vg according to the bias control value of the conversion unit 250.

The power amplification circuit part 100 may include an input matching unit 110, a power amplifier 120, and an output matching unit 130. The input matching unit 110 may perform impedance matching between an RF input terminal RFin and the power amplifier 120. The power amplifier 120 may amplify the power of a signal from the input matching unit 110 and output the power of the signal from the output matching unit 130. The output matching unit 130 may perform impedance matching between the power amplifier 120 and the RF output terminal RFout.

Figure 2:
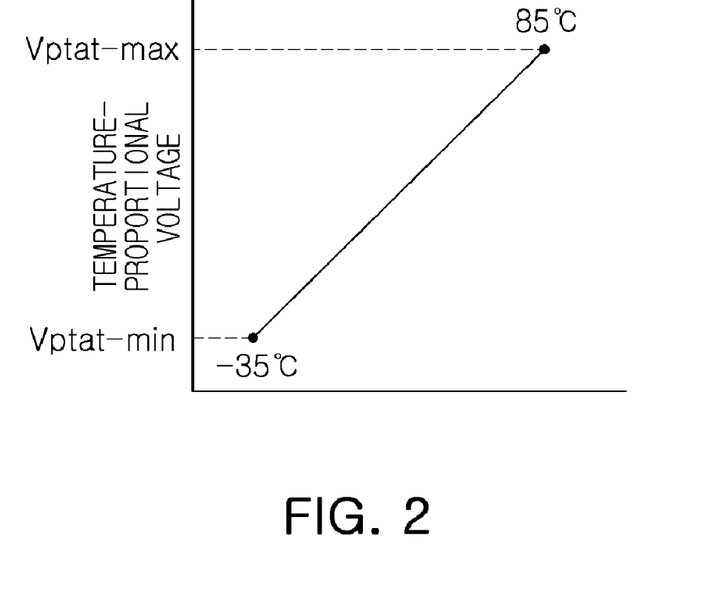
FIG. 2 is a graph illustrating temperature-proportional voltage-temperature characteristics of a temperature detection unit according to an exemplary embodiment of the present invention.

FIG. 2 is a graph illustrating temperature-proportional voltage-temperature characteristics of a temperature detection unit. In the graph as illustrated in FIG. 2, the temperature detection unit generates the temperature-proportional voltage Vptat in proportion to temperature.

Figure 3:
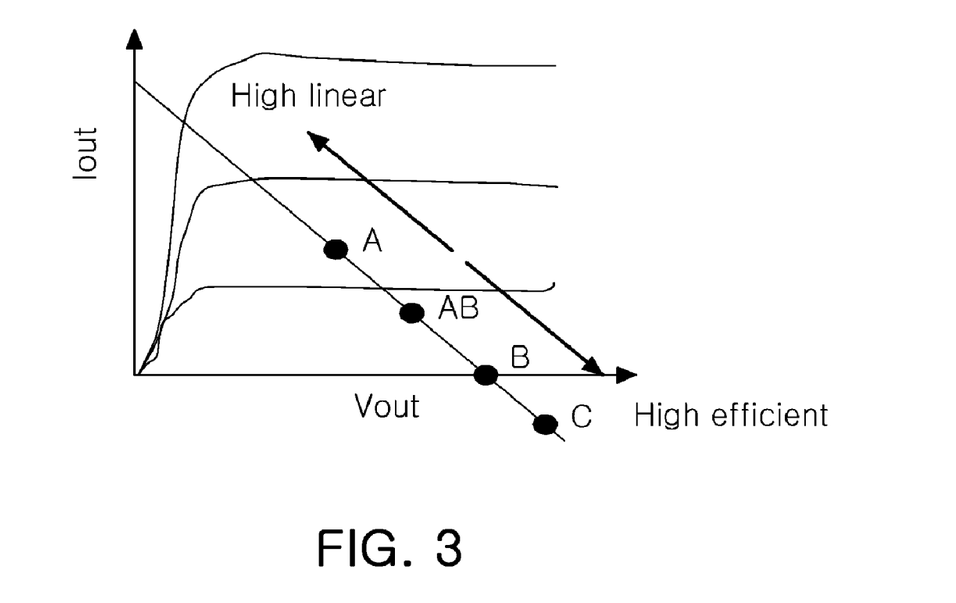
FIG. 3 is a graph illustrating an operating region by class types of a power amplification circuit part according to an exemplary embodiment of the present invention.

FIG. 3 is a graph illustrating an operating region by class type of a power amplification circuit part according to an exemplary embodiment of the invention. In the graph as illustrated in FIG. 3, class A, class AB, class B and class C, corresponding to the operating region of the power amplification circuit part, are shown.

Figure 4:
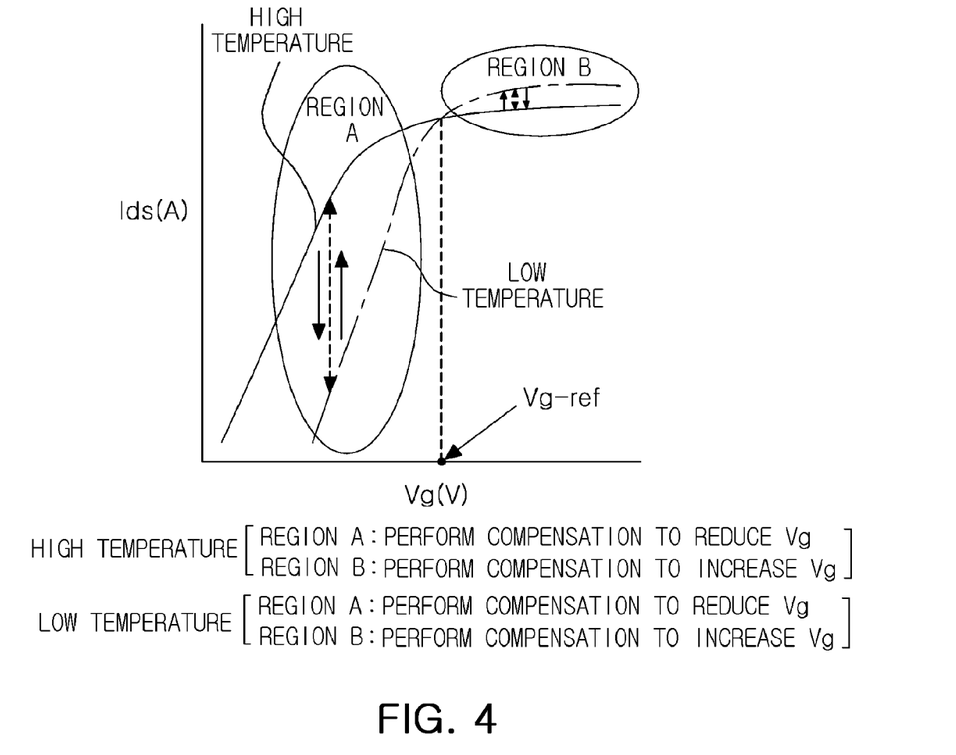
FIG. 4 is a graph illustrating a gate bias voltage (Vg)-drain-source current (Ids) of a power amplification circuit part according to an exemplary embodiment of the present invention.

FIG. 4 is a graph illustrating gate bias voltage Vg-drain-source current (Ids) characteristics of a power amplification circuit part according to an exemplary embodiment of the invention. In the graph illustrated in FIG. 4, gate bias voltage Vg-drain-source current (Ids) characteristics, depending on temperature variations, are varied according to the operating regions of a power amplification circuit part.

Figure 5:
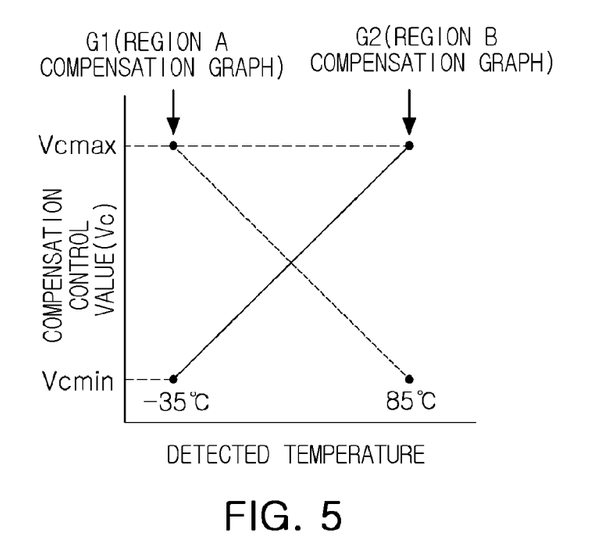
FIG. 5 is a graph illustrating a compensation control value-detected temperature characteristics according to class types of a temperature compensation control unit according to an exemplary embodiment of the present invention.

FIG. 5 is a graph illustrating compensation control value-detected temperature characteristics by operating region of class type of a temperature compensation control unit according to an exemplary embodiment of the invention. In the graph illustrated in FIG. 5, a detected temperature is in inverse proportion to a compensation control value in a region A corresponding to class A, whereas a detected temperature is in inverse proportion to a compensation control value in a region corresponding to class B.

Figure 6:
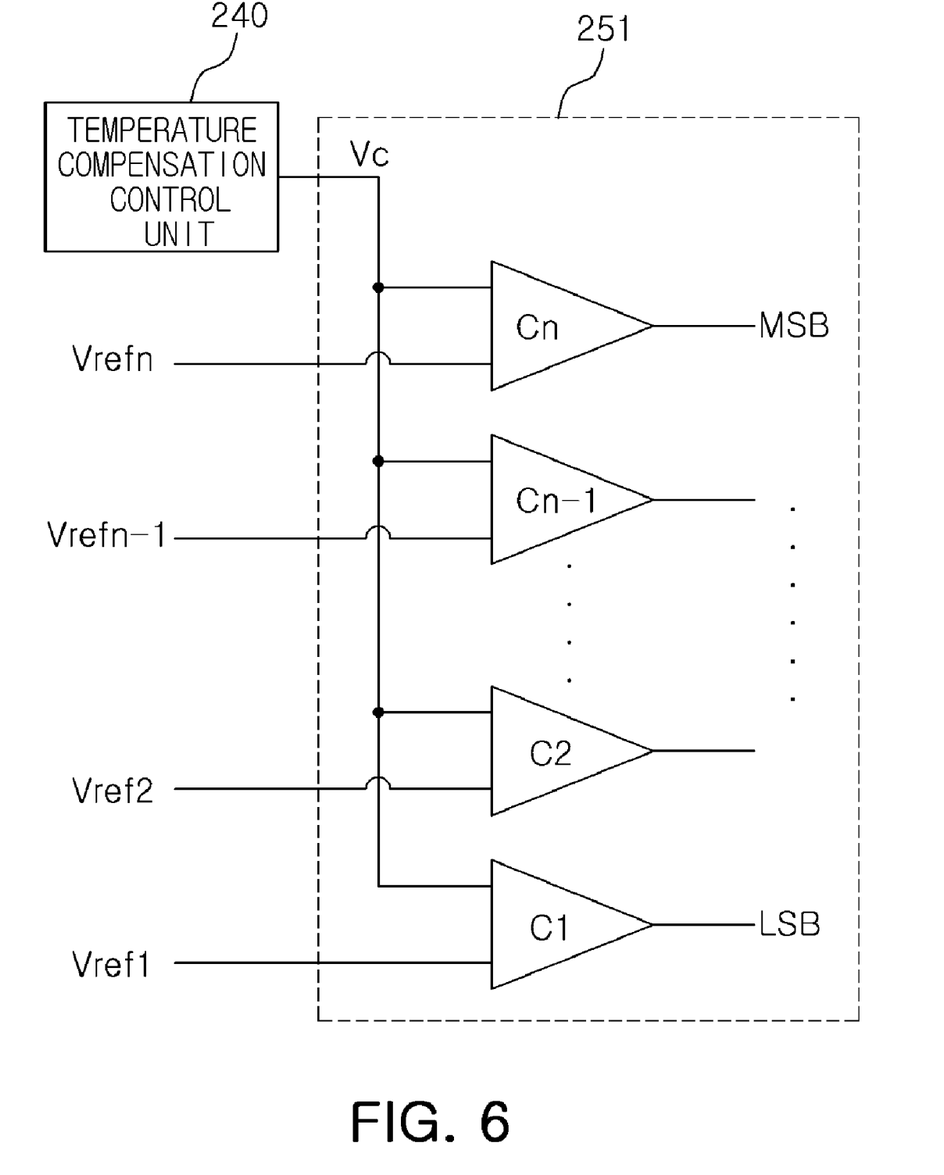
FIG. 6 is a circuit diagram illustrating a first conversion unit according to an exemplary embodiment of the present invention.

FIG. 6 is a circuit diagram illustrating a first conversion unit according to an exemplary embodiment of the invention.

Referring to FIG. 6, the conversion unit 250 may include a first conversion unit 251 that converts the compensation control value Vc of the temperature compensation control unit 240 into a digital signal and a second conversion unit 252 that converts the digital signal from the first conversion unit 251 into a bias control value.

The first conversion unit 251 may include a plurality of first to n-th comparators C1 through Cn that individually compare the compensation control value Vc of the temperature compensation control unit 240 with a plurality of reference voltages Vref1 through Vrefn to convert the compensation control value Vc into respective digital codes according to comparison results.

The first conversion unit 251 may be designed to convert the compensation control value Vc according to a first conversion resolution at a predetermined low temperature and convert the compensation control value Vc according to a second conversion resolution, which is lower than the first conversion resolution, at a predetermined high temperature.

Figure 7:
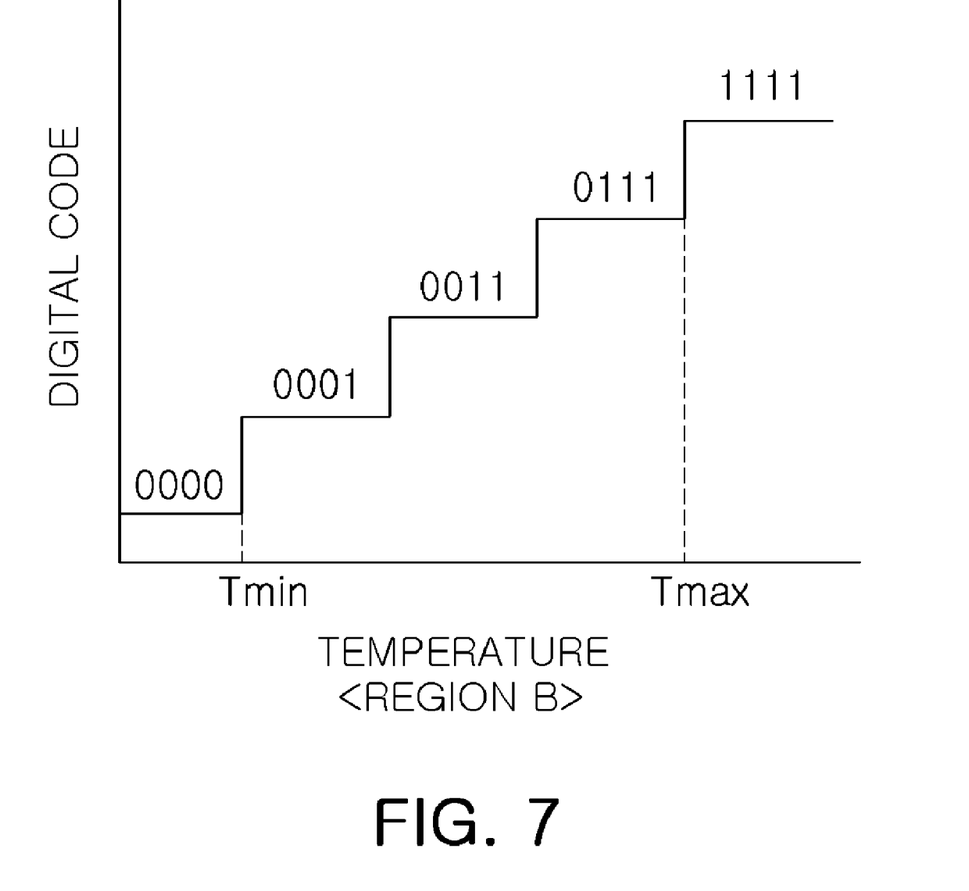
FIG. 7 is a graph exemplifying digital codes by temperature in a first conversion unit according to an exemplary embodiment of the present invention.

FIG. 7 is a graph exemplifying digital codes by temperature in a first conversion unit according to an exemplary embodiment of the invention. In FIG. 7, 4-bit digital codes having different values depending on temperatures are shown.

Hereinafter, the operation and effect of the invention will be described with reference to the accompanying drawings.

A CMOS power amplifier according to an exemplary embodiment of the invention will now be described with reference to FIGS. 1 through 7. In the CMOS power amplifier, as shown in FIG. 1, the bias circuit unit 210 according to this embodiment generates the gate bias voltage Vg and supplies the generated gate bias voltage Vg to the power amplification circuit part 100.

The power amplification circuit part 100 is provided with the gate bias voltage Vg from the bias circuit unit 210, amplifies the power of an input signal, being input through the RF input terminal RFin, and outputs the input signal having the amplified power through the RF output terminal RFout.

Since the gate bias voltage Vg of the power amplification circuit part 100 performing the above-described operation is varied according to temperature, temperature compensation needs to be carried out. Here, temperature compensation needs to be performed differently depending on the class type of the power amplification circuit part 100. This will be described in detail.

The bias detection unit 220 of the power amplifier according to this embodiment determines the class type of the power amplification circuit part 100 according to the gate bias voltage Vg and then provides information about the determined class type to the temperature compensation control unit 240.

Furthermore, the temperature detection unit 230 according to this embodiment detects the temperature-proportional voltage Vptat in proportion to ambient temperature and provides the temperature-proportional voltage Vptat to the temperature compensation control unit 240.

The temperature compensation control unit 240 generates the compensation control value Vc according to the temperature-proportional voltage Vptat in the class type determined by the bias detection unit 220 and provides the compensation control value Vc to the conversion unit 250.

The conversion unit 250 converts the compensation control value Vc of the temperature compensation control unit 240 into a linear bias control value and provides the linear bias control value to the bias circuit unit 210.

Here, the bias circuit unit 210 may compensate the gate bias voltage Vg according to the bias control value of the conversion unit 250.

The power amplification circuit part 100 may include the input matching unit 110, the power amplifier 120 and the output matching unit 130. In this case, while the input matching unit 110 may perform impedance matching between the RF input terminal RFin and the power amplifier 120, the power amplifier 120 amplifies the power of the signal from the input matching unit 110 and outputs the signal to the output matching unit 130. The output matching unit 130 may perform impedance matching between the power amplifier 120 and the RF output terminal RFout.

Referring to FIG. 2, the temperature detection unit 230 may generate the temperature-proportional voltage Vptat in proportion to a detected temperature.

Referring to FIG. 3, the power amplification circuit part 100 operates in an operating region corresponding to one of class A, class AB, class B and class C.

For example, referring to FIG. 4, the bias detection unit 220 compares the gate bias voltage Vg being detected with a predetermined gate bias reference voltage Vg-ref and determines that the power amplification circuit part 100 operates in class A (region A) when the gate bias voltage Vg is lower than the predetermined gate bias reference voltage Vg-ref. On the other hand, when the gate bias voltage Vg is not lower than the predetermined gate bias reference voltage Vg-ref, the bias detection unit 220 determines that the power amplification circuit part 100 operates in class B (region B).

When high temperature is determined in region A, the temperature compensation control unit 240 is operated so that the compensation control value Vc can be reduced. On the other hand, when low temperature is determined in region A, the temperature compensation control unit 240 is operated so that the compensation control value Vc can be increased. That is, in region A, the higher the temperature is, the larger the amount of current that flows is. Therefore, if the temperature rises, a bias value needs to be controlled so that a voltage, being applied to the power amplification circuit part 100, may be reduced. If the temperature drops, the amount of current that flows is reduced. Therefore, the bias value being applied is controlled to be increased to thereby appropriately perform temperature compensation. Accordingly, the characteristics of the power amplification circuit part 100 remain constant regardless of temperature variations.

Furthermore, when high temperature is determined in region B, the temperature compensation control unit 240 is operated so that the compensation control value Vc may be increased. On the other hand, when low temperature is determined in region B, the temperature compensation control unit 240 is operated so that the compensation control value Vc may be reduced. That is, in region B, the higher the temperature is, the smaller the amount of current flows. Therefore, when the temperature rises, a bias voltage is controlled to be increased. On the other hand, when the temperature drops, the amount of current flowing is increased. Therefore, the bias voltage is controlled to be reduced so that the characteristics of the power amplification circuit part 100 remain constant regardless of temperature variations.

Further explanation concerning the above-described operation will now be provided with reference to FIG. 5. The temperature compensation control unit 240 determines a compensation control value in inverse proportion to a detected temperature in region A corresponding to class A. On the contrary, the temperature compensation control unit 240 determines a compensation control value in proportion to a detected temperature in region B corresponding to class B.

Referring to FIG. 6, when the conversion unit 250 includes the first conversion unit 251 and the second conversion unit 253, the first conversion unit 251 converts the compensation control value Vc of the temperature compensation control unit 240 into a digital signal and outputs the digital signal to the second conversion unit 252.

The second conversion unit 252 converts the digital signal from the first conversion unit 251 into a bias control value.

In particular, when the first conversion unit 251 includes the plurality of first to n-th comparators C1 through Cn, the plurality of first to n-th comparators C1 through Cn individually compare the compensation control value Vc of the temperature compensation control unit 240 with the plurality of reference voltages Vref1 through Vrefn and convert the compensation control value Vc into respective digital codes according to comparison results.

Here, the first conversion unit 251 may perform conversion according to the first conversion resolution at the predetermined low temperature. On the other hand, the first conversion unit 251 may perform conversion according to the second conversion resolution, which is lower than the first conversion resolution, at the predetermined high temperature.

For example, when the first conversion unit 251 includes first through fourth comparators, the first through fourth comparators compare the compensation control value Vc of the temperature compensation control unit 240 with first through fourth reference voltages Vref1 through Vref4 and convert the compensation control value Vc into 4-bit digital codes as shown in FIG. 7.

Referring to FIGS. 6 and 7, since the bias value necessary for temperature variations is not linearly changed, digitalization using the first conversion unit 251 is performed in order to control a temperature variation range. For example, as variations at low temperature determine the characteristics of the power amplification circuit part, a temperature variation range at low temperature is subdivided, while a temperature variation range at high temperature is set to be wide, thereby improving the characteristics of the power amplifier.

Furthermore, referring to FIGS. 6 and 7, for example, the operation of the first conversion unit 251 will be described. A voltage ptat, indicating temperature variations, is applied to one input of the comparator, and a reference voltage is applied to the other input of the comparator.

For example, when Vptat_min=0.3V and Vptat_max=0.5V are satisfied and the first through fourth comparators are used, a range from 0.3V to 0.5V may be divided into five sub-ranges.

First, when it is −35° C. or below, and the voltage ptat is 0.3V or less, the first conversion unit 251 has an output of 0000. When the temperature then rises, and the voltage ptat is between 0.37 and 0.3V, the first conversion unit 251 has an output of 0001. When the voltage ptat is between 0.44 and 0.37V, the first conversion unit 251 has an output of 0011. When the voltage ptat is between 0.5 and 0.44V, the first conversion unit 251 has an output of 0111. Finally, when it is 85° C. or higher, and the voltage ptat is higher than 0.5V, the first conversion unit 251 has an output of 1111.

The digital code, generated by the first conversion unit 251, is converted into a bias control value through the second conversion unit 253, corresponding to an A/D converter, in order to control the bias voltage necessary for the power amplification circuit part.

According to the above-described invention, the compensation of a bias voltage is controlled using a temperature-proportional voltage according to temperature variations and a bias value being applied to a power amplifier to thereby compensate the characteristics of a power amplification circuit part, which have been changed according to temperature variations, so that the power amplification circuit part performs an amplification operation in a normal operating region to thereby maintain constant characteristics.

As set forth above, according to exemplary embodiments of the invention, temperature compensation is performed on a gate bias voltage according to the class type of a CMOS power amplifier to thereby perform power amplification in a normal operating region, thereby maintaining constant characteristics regardless of temperature changes.

While the present invention has been shown and described in connection with the exemplary embodiments, it will be apparent to those skilled in the art that modifications and variations can be made without departing from the spirit and scope of the invention as defined by the appended claims.

What is claimed is:

1. A temperature compensation circuit of a CMOS power amplifier, the temperature compensation circuit comprising:
a bias circuit unit supplying a gate bias voltage to a power amplification circuit part;
a bias detection unit determining a class type of the power amplification circuit part according to the gate bias voltage;
a temperature detection unit detecting a temperature-proportional voltage in proportion to ambient temperature;
a temperature compensation control unit generating a compensation control value according to the temperature-proportion voltage in the class type determined by the bias detection unit; and
a conversion unit converting the compensation control value of the temperature compensation control unit into a linear bias control value and providing the linear bias control value to the bias circuit unit,
wherein the bias circuit unit compensates the gate bias voltage according to the linear bias control value of the conversion unit.

2. The temperature compensation circuit of claim 1, wherein the conversion unit comprises:
a first conversion unit converting the compensation control value of the temperature compensation control unit into a digital signal; and
a second conversion unit converting the digital signal from the first conversion unit into the linear bias control value.

3. The temperature compensation circuit of claim 2, wherein the first conversion unit comprises a plurality of first through n-th comparators individually comparing the compensation control value of the temperature compensation control unit with a plurality of reference voltages and converting the compensation control value into respective digital codes according to comparison results.

4. The temperature compensation circuit of claim 3, wherein the first conversion unit performs conversion according to a first conversion resolution at a predetermined low temperature and performs conversion according to a second conversion resolution at a predetermined high temperature.

5. A CMOS power amplifier comprising:
a power amplification circuit part operating according to a gate bias voltage and amplifying a power of an input signal;
a bias circuit unit generating the gate bias voltage;
a bias detection unit determining a class type of the power amplification circuit part according to the gate bias voltage;
a temperature detection unit detecting a temperature-proportional voltage in proportion to ambient temperature;
a temperature control unit generating a compensation control value according to the temperature-proportional voltage in the class type determined by the bias detection unit; and
a conversion unit converting the compensation control value of the temperature compensation control unit into a linear bias control value,
wherein the bias circuit unit compensates the linear gate bias voltage according to the bias control value of the conversion unit.

6. The CMOS power amplifier of claim 5, wherein the power amplification circuit part comprises an input matching unit, a power amplifier, and an output matching unit,
the input matching unit performs impedance matching between an RF input terminal and the power amplifier,
the power amplifier amplifies a power of a signal from the input matching unit, and
the output matching unit performs impedance matching between the power amplifier and an RF power terminal.

7. The CMOS power amplifier of claim 6, wherein the conversion unit comprises:
a first conversion unit converting the compensation control value of the temperature compensation control unit into a digital signal; and
a second conversion unit converting the digital signal from the first conversion unit into the linear bias control value.

8. The CMOS power amplifier of claim 7, wherein the first conversion unit comprises first through n-th comparators individually comparing the compensation control value of the temperature compensation unit with a plurality of reference voltages and converting the compensation control value into respective digital codes according to comparison results.

9. The CMOS power amplifier of claim 8, wherein the first conversion unit performs conversion according to a first conversion resolution at a predetermined low temperature and performs conversion according to a second conversion resolution at a predetermined high temperature.

* * * * *